United States Patent [19]
Lee

[11] Patent Number: 6,146,918
[45] Date of Patent: Nov. 14, 2000

[54] METHOD OF FABRICATING A SEMICONDUCTOR PACKAGE

[75] Inventor: Ju-Hwa Lee, Cheongju, Rep. of Korea

[73] Assignee: LG Semicon Co., LTD, Chungcheongbuk-Do, Rep. of Korea

[21] Appl. No.: 09/195,996

[22] Filed: Nov. 20, 1998

[30] Foreign Application Priority Data

May 30, 1998 [KR]  Rep. of Korea ...................... 98-20099

[51] Int. Cl.⁷ .................................................. H01L 21/44
[52] U.S. Cl. .......................... 438/106; 438/123; 438/125; 257/678; 257/666
[58] Field of Search .................................. 438/106, 125, 438/123; 257/666, 678

[56] References Cited

U.S. PATENT DOCUMENTS

| | | | |
|---|---|---|---|
| 5,673,479 | 10/1997 | Hawthorne | 29/832 |
| 5,736,432 | 4/1998 | Mackessy | 438/123 |
| 5,744,382 | 4/1998 | Kitayama et al. | 438/106 |
| 5,776,802 | 7/1998 | Ochi et al. | 438/123 |
| 5,963,796 | 10/1999 | Kim | 438/125 |

*Primary Examiner*—Matthew Smith
*Assistant Examiner*—Belur Keshavan
*Attorney, Agent, or Firm*—Morgan, Lewis & Bockius LLP

[57] ABSTRACT

A semiconductor package includes a semiconductor package substrate having a frame type insulator which has a penetrating portion in a center portion of the substrate and a plurality of lead bars exposed to upper and lower surfaces of the insulator, a semiconductor chip on the semicondcutor package substrate, an upper surface of the semiconductor chip being attached to the lead bars, a plurality of pads on a center portion of an upper surface of the semiconductor chip, a plurality of wires respectively connecting the pads with an upper surface of the lead bars, and an upper cover protecting the wires, the pads and an upper surface of the semiconductor chip.

12 Claims, 7 Drawing Sheets

METHOD OF FABRICATING A SEMICONDUCTOR PACKAGE

This Application claims the benefit of Korean Application No. 98-20099 filed May 30, 1998, which is hereby incorporated by reference.

BACKGROUND OF THE INVENTION

1. Field of the Invention

The present invention relates to a semiconductor device, and more particularly to a semiconductor package and a method of fabricating the same. Although the present invention is suitable for a wide scope of applications, it is particularly suitable for providing a more degree of freedom in designing a semiconductor package and improving a reliability of the package.

2. Discussion of the Related Art

Generally, a column lead type semiconductor package having leads buried in an insulator is widely used in the semiconductor industry because it is endurable to physical impacts and the leads are not bent by the exterior force. A background art column lead type semiconductor package will be described with reference to FIG. 1.

Figure 1:
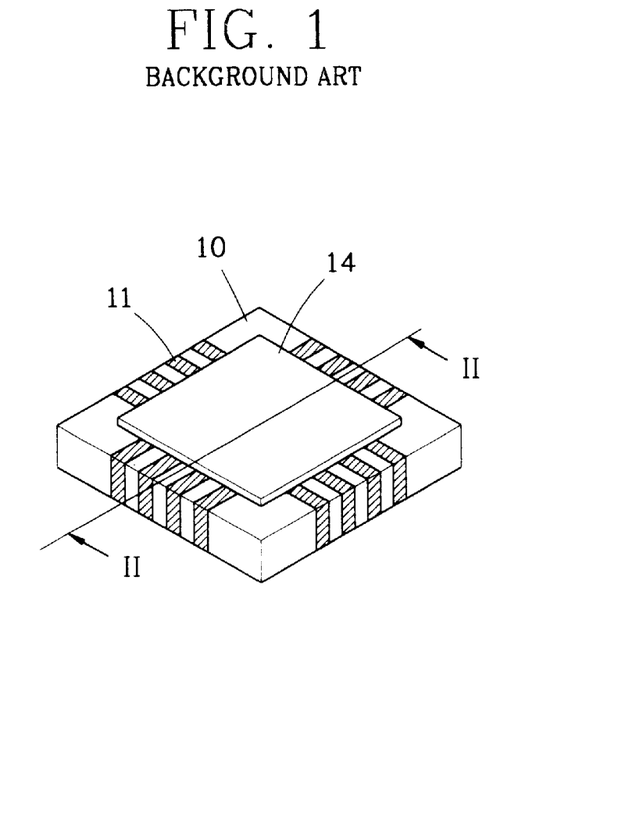
FIG. 1 is a perspective view illustrating a background art semiconductor package.
Figure 2:
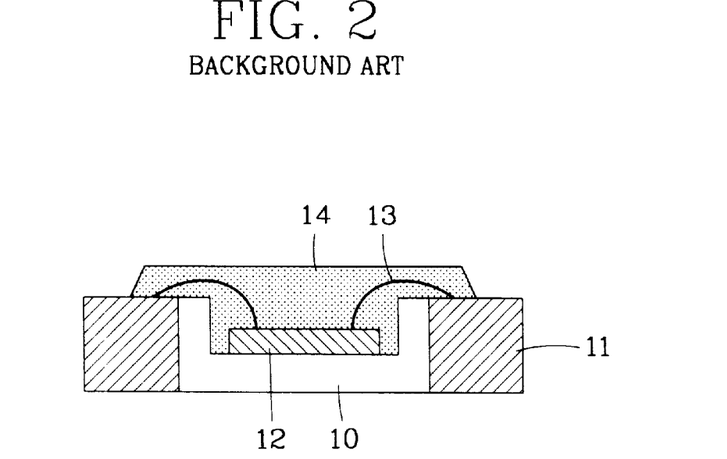
FIG. 2 is a cross-sectional view illustrating the background art along with the line II–II' of FIG. 1.

The background art column lead semiconductor package is illustrated as shown in FIG. 1. FIG. 2 is a cross-sectional view illustrating a structure of the background art semiconductor package along with the line II–II' of FIG. 1. In the background art column lead semiconductor package, an insulator 10 is formed using a molding compound, and lead bars 11 are formed to be exposed at upper and lower surface of the insulator 10. A semiconductor chip 12 is attached to the upper surface of the insulator 10 by a polyamide adhesive, and a plurality of bonding pads (not shown) are formed on the upper surface. The bonding pads are connected to predetermined parts of the lead bars 11 with corresponding wires 13, and the wires 13 and the semiconductor chip 12 are protected by a molding compound coating 14.

A fabrication method of the background art column lead type semiconductor chip package will be described in detail with reference to FIGS. 3A to 3D.

Figure 3A:
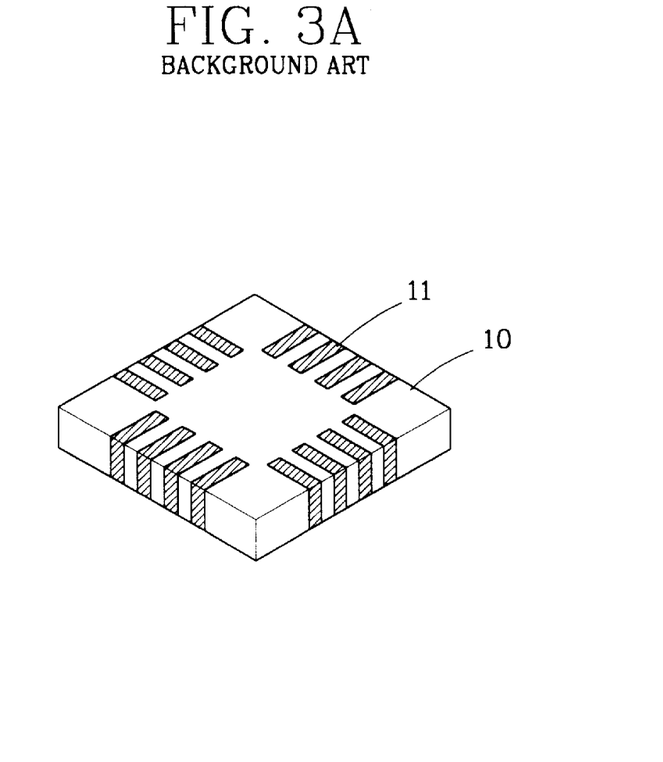
FIGS. 3A through 3D are perspective views illustrating the process steps of fabricating method of the background art semiconductor package.

In FIG. 3A, a semiconductor package substrate is fabricated with a plurality of lead bars 11 buried in an insulator 10. The lead bars 11 are exposed at upper and lower surface of the insulator 10. To form such a semiconductor package substrate, thin metal conductive plates which will be the lead bars supported by predetermined supporting members are put in a frame. A liquid molding compound is then filled and hardened in the frame. The frame is removed and a formed structure is sliced, thereby completing the semiconductor package.

Figure 3B:
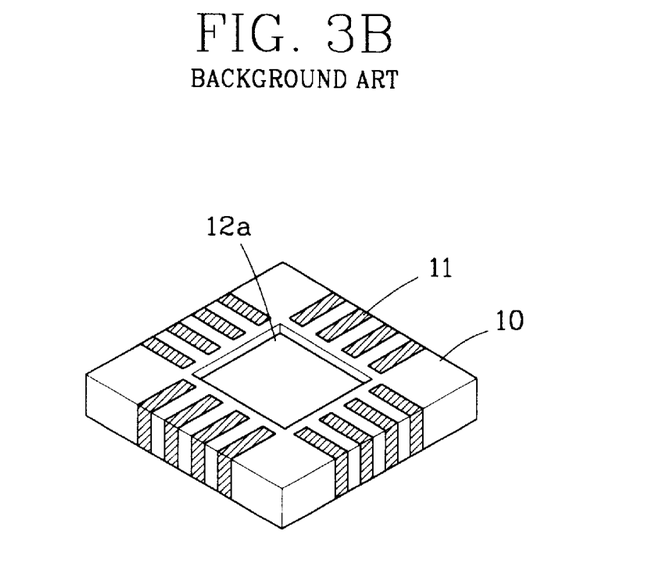

Referring to FIG. 3B, a center portion of the semiconductor package substrate of FIG. 1 is grinded to form a recess 12a.

Figure 3C:
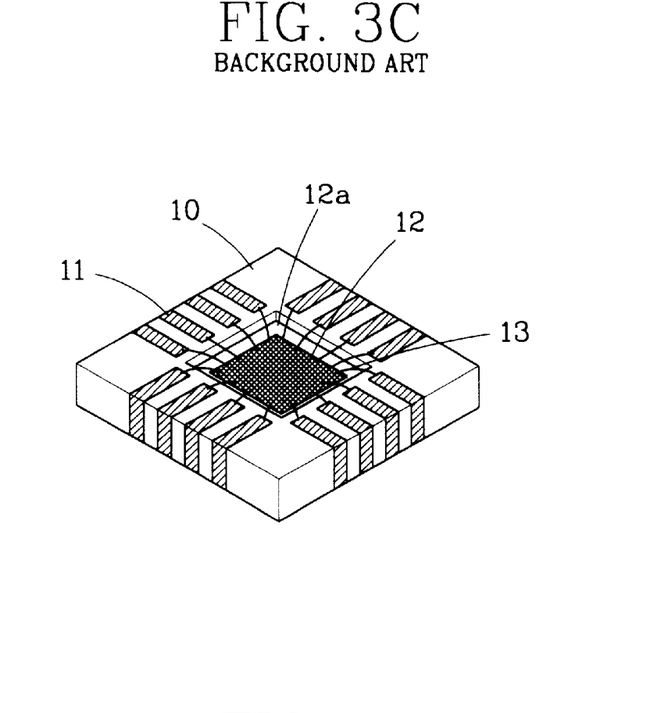

Next, in FIG. 3C, a semiconductor chip 12 is attached onto the recess 12a and pads (not shown) formed on a marginal portion of the semiconductor chip 12 are connected with a predetermined portion of each of the lead bars 11 by wires 13.

Figure 3D:
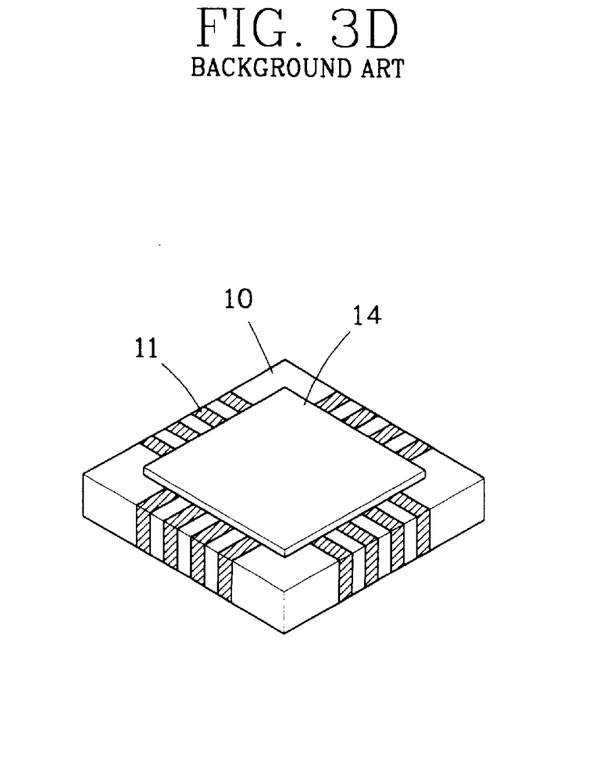
Figure 4:
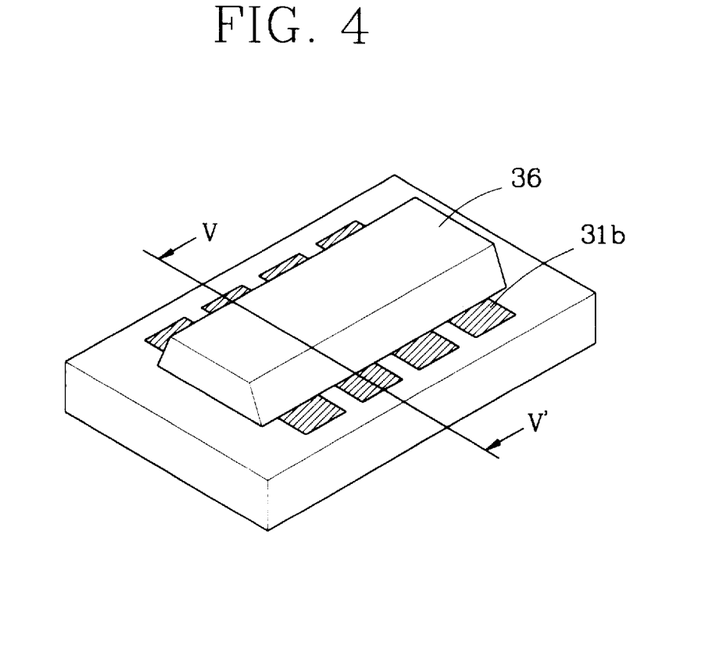
FIG. 4 is a perspective view illustrating a semiconductor package according to a first embodiment of the present invention.

In FIG. 3D, the wires 13, the recess 12a, and the semiconductor chip 12 are protected by a molding compound coating 14.

As described above, the semiconductor chip having the pads connected to the lead bars by the corresponding wires formed on the center portion is called a center pad type semiconductor chip. Since the center pad type semiconductor chip has the chips on the center portion, it provides a more degree of freedom in designing comparing to the other types of semiconductor chips.

However, it is difficult to apply the background art column lead type semiconductor package to a packaging of the center pad type semiconductor chip. Specifically, when pads are formed on a center portion of the upper surface of the semiconductor chip, each pad is considerably apart from the corresponding lead bar. As a result, a wiring process is much difficult to be accomplished.

SUMMARY OF THE INVENTION

Accordingly, the present invention is directed to a semiconductor package and a method of fabricating the same that substantially obviates of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a column lead type semiconductor package includes a frame-type insulator having a penetrating portion in a center thereof, a semiconductor package substrate having a plurality of lead bars which are laid in the insulator at both sides of the penetrating portion, being exposed at upper and lower surfaces of the insulator, and each lead bar has a "]" shape having a horizontal leg and a vertical leg, a semiconductor chip of which an upper marginal portion is attached to lower surfaces of the horizontal legs of the lead bars and an upper center portion has a plurality of pads, a plurality of wires connecting each pad and a predetermined upper portion of the vertical leg of each lead bar, and an upper cover protecting the wires, the pads and an upper surface of the semiconductor chip.

In another aspect of the present invention, a method of fabricating a column lead type semiconductor package includes the steps of fabricating a semiconductor package substrate having a frame-type insulator provided with a penetrating portion thereof and a plurality of lead bars which are laid in the insulator formed at both sides of the penetrating portion, being exposed at upper and lower surfaces of the insulator, and each lead bar has a "]" shape having a horizontal leg and a vertical leg; attaching an upper marginal portion of a semiconductor chip of which an upper center portion has a plurality of pads thereon to lower surfaces of the horizontal legs of the lead bars; connecting each pad and a predetermined upper portion of each lead bar by wires; and protecting the wires an upper surface of the semiconductor chip.

In another aspect of the present invention, a method of fabricating a column lead type semiconductor package includes the steps of fabricating a semiconductor package substrate comprised of the sub-steps of placing a plurality of metal bars in a frame, fabricating a column by hardening an epoxy resin in the frame, forming a penetrating portion in a center portion of the column, fabricating a column unit by cutting the column at predetermined thickness and forming a recess in an inner side of each column, in the step each of the metal bars is consequently transformed to a "]" shape; attaching an upper marginal portion of a semiconductor chip of which an upper center portion has a plurality of pads thereon to lower surfaces of horizontal legs of the lead bars; connecting each pad and a predetermined upper portion of each lead bar by wires; and protecting the wires an upper surface of the semiconductor chip.

In another aspect of the present invention, a semiconductor package includes a semiconductor package substrate having a frame type insulator which has a penetrating portion in a center portion of the substrate and a plurality of lead bars exposed to upper and lower surfaces of the insulator, a semiconductor chip on the semiconductor package substrate, an upper surface of the semiconductor chip being attached to the lead bars, a plurality of pads on a center portion of an upper surface of the semiconductor chip, a plurality of wires respectively connecting the pads with an upper surface of the lead bars, and an upper cover protecting the wires, the pads and an upper surface of the semiconductor chip.

In another aspect of the present invention, a method of fabricating a semiconductor package, comprising the steps of forming a semiconductor package substrate having a frame-type insulator which has a penetrating portion in a center of the semiconductor package substrate and a plurality of leads buried in both circumferential surfaces of the insulator at both sides of the penetrating portion, attaching an upper surface of a semiconductor chip having a plurality of pads on a center portion to lower surfaces of the leads, connecting the pads with upper surfaces of the corresponding leads by wires, and forming an upper cover to protect the wires, the pads, and an upper surface of the semiconductor chip.

In a further aspect of the present invention, a method of fabricating a semiconductor package, comprising the steps of forming a semiconductor package substrate having a frame-type insulator which has a penetrating portion in a center of the semiconductor package substrate and a plurality of leads buried in both circumferential surfaces of the insulator at both sides of the penetrating portion, attaching an upper surface of a semiconductor chip on a center portion to lower surfaces of the leads using a conductive adhesive, and forming an upper cover to protect an upper surface of the semiconductor chip.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 5:
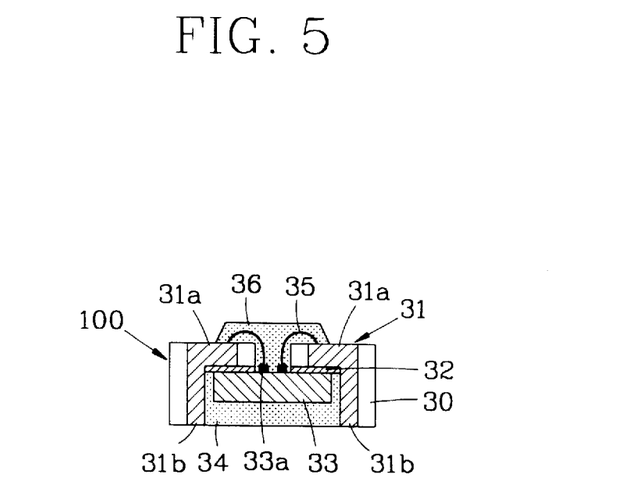
FIG. 5 is a cross-sectional view illustrating a semiconductor package along with the line V–V' of FIG. 4 according to the first embodiment of the present invention.

A cross-sectional view of a column lead type semiconductor package in the present invention is shown in FIG. 5. A semiconductor package substrate 100 is provided at the outer surface of the package, and lead bars 31 are buried in the inside of a frame type insulator 30 having a penetrating portion in the center portion. Each of the lead bars is exposed at the upper and lower surfaces of the insulator 30. Each of the lead bars 31 having a "]" shape includes a horizontal leg part 31a which extends horizontally and a vertical leg part 31b which vertically extends from the end of the horizontal leg part 31a. The lead bars 31 are arranged facing each other, and positioned around the center portion of the substrate 100. The lead bars 31 at both sides of the substrate 100 are separated each other by a predetermined distance.

An upper surface of a semiconductor chip 33 is attached to lower surfaces of the horizontal leg part 31a of the lead bars 31 using an adhesive 32, and a plurality of pads 33a formed on the center portion of the upper surface are separated with the lead bars 31 by a predetermined distance at the both sides of the semiconductor chip 33.

The pads 33a are respectively connected to the lead bars 31 by corresponding wires 35. That is, the wires 35 connect to the pads 33a and predetermined portions of the horizontal leg part 31a of the corresponding lead bars 31.

A molding compound is filled in an inner space of the vertical leg part 31b of the lead bars 31 at the both sides of the semiconductor chip 33. In this process, a part filled with the molding compound becomes a lower coating 34 which protects a lower surface and each side surface of the semiconductor chip 33. Further, another molding compound protects an upper surface of the semiconductor chip 33, the pads 33a formed thereon and the wires 35, and the molding compound portion formed on the upper surface thereof is an upper coating 36.

With reference to the accompanying drawings, a method of fabricating the column lead type semiconductor package according to the present invention will be described.

Figure 6A:
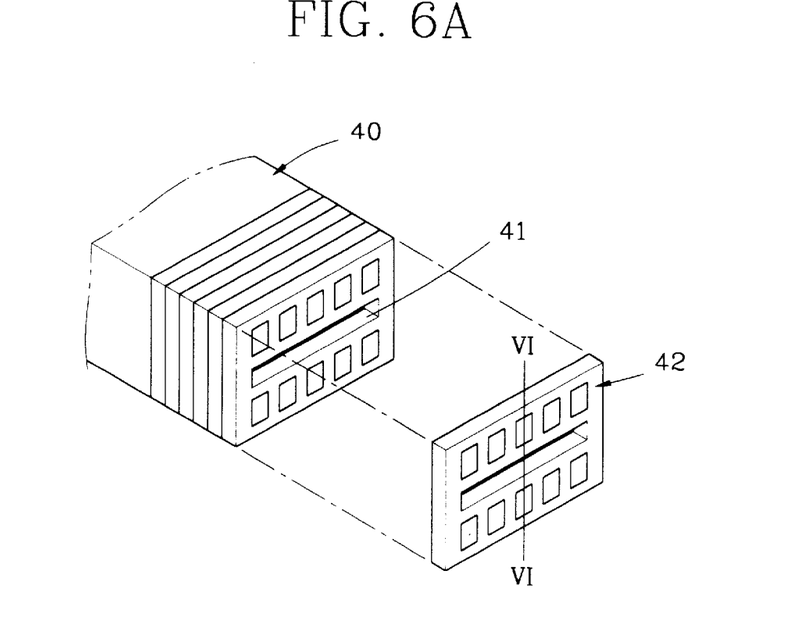
FIGS. 6A through 6G are cross-sectional views illustrating the process steps of fabricating method of a semiconductor package according to the first embodiment of the present invention.

In FIG. 6A, a column 40 is cut to form a column unit 42 having at a predetermined thickness. The column unit 42 includes a plurality of metal lead bars in a frame, an epoxy resin is filled and hardened in the frame. After removing the frame, a penetrating portion 41 is formed in the center portion of the column 40 and the column is sliced to have a predetermined thickness.

FIGS. 6B to 6G are cross-sectional views illustrating a semiconductor package along with the line VI–VI' of FIG. 6A.

Figure 6B:
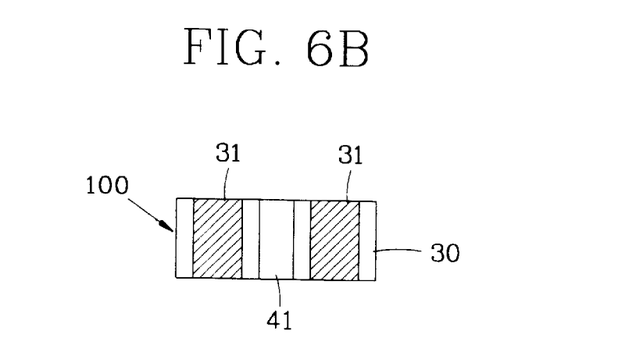

Initially referring to FIG. 6B, the semiconductor package substrate 100 of the column lead type semiconductor package according to the present invention is upside-down. The semiconductor package substrate 100 includes an insulator 30 and a lead bar 31 having a horizontal leg part 31a and a vertical leg part 31b.

Figure 6C:
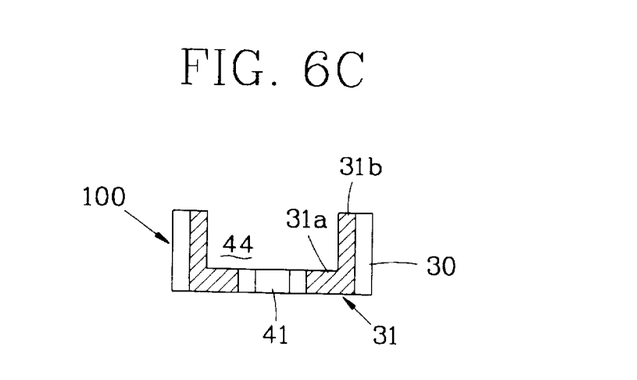

In FIG. 6C, a recess 44 is formed on one side of the column unit 42 (shown in FIG. 6A) providing a space for a semiconductor chip. The recess 44 is normally formed by a grinding process.

Figure 6D:
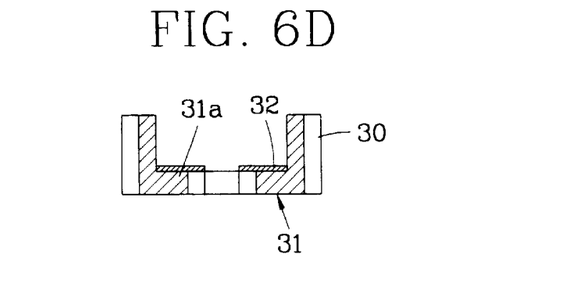
Figure 6E:
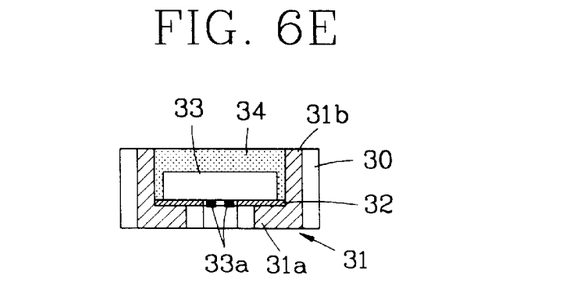

After an adhesive 32 is applied to one side of the horizontal leg part of the lead bar 31, as shown in FIG. 6D, a semiconductor chip 33 is attached to the adhesive 32, so that the adhesive 32 is in contact with the upper surface of the semiconductor chip 33 in FIG. 6E. Here, the upper surface of the semiconductor chip 33 indicates the surface where the pads 33a are formed, and the pads 33a are exposed through the penetrating portion 41. The penetrating portion 41 is a gap between the horizontal leg parts 31a at the both sides of the lead bars 31. To cover the lower surface of the semiconductor chip 33, the inside of the vertical leg parts 31b of the lead bars 31 is filled with a molding compound, thereby forming a lower coating 34.

Figure 6F:
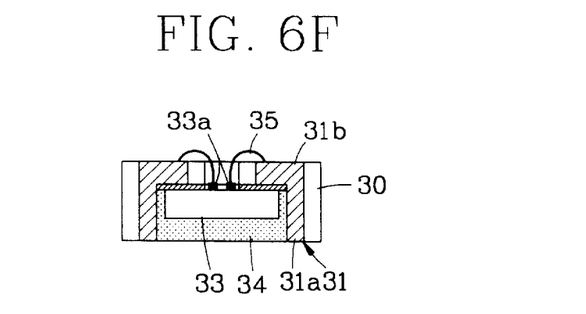

Next, the structure of FIG. 6E is upside-down, as shown in FIG. 6F, and a wiring process is performed to connect the pads 33a with the portions of the horizontal leg parts 31a of the lead bars 31 corresponding to the pads 33a by wires 35.

Figure 6G:
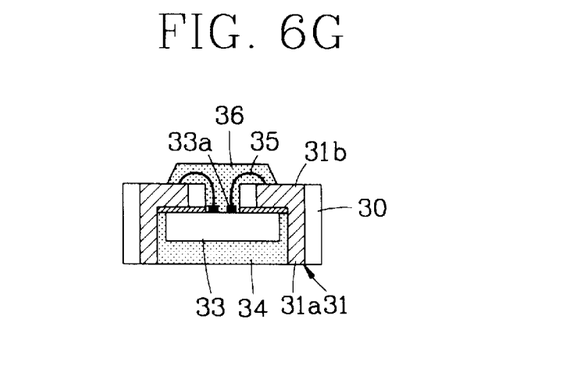

In FIG. 6G, an upper coating 36 is formed by a molding process to protect the pads 33a, the wires 35, and the upper surface of the semiconductor chip 33, thereby completing a column lead type semiconductor package according to the present invention.

Figure 7A:
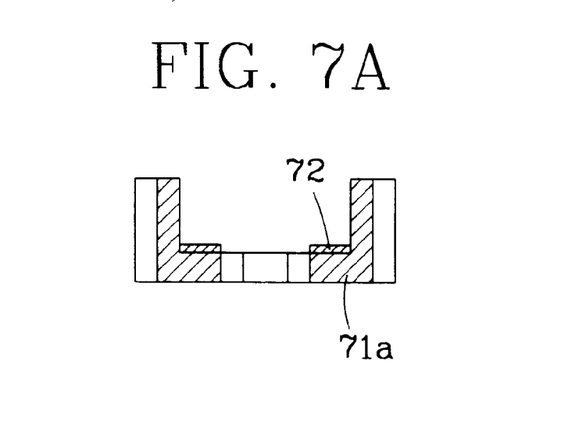
FIGS. 7A through 7C are cross-sectional views illustrating the process steps of fabricating method of a semiconductor package according to a second embodiment of the present invention.
Figure 7B:
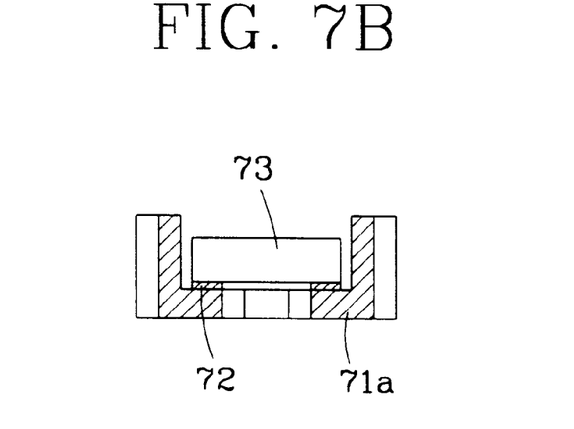
Figure 7C:
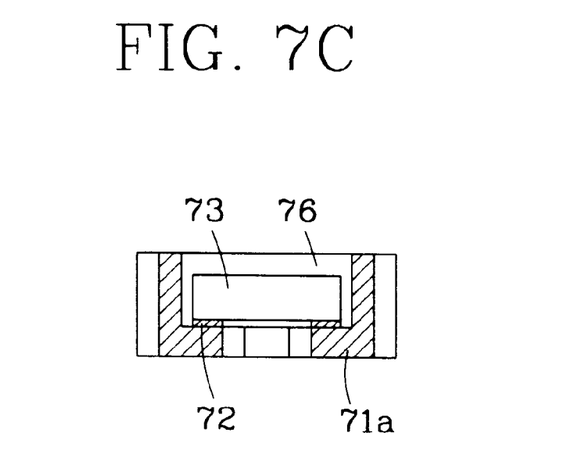

FIGS. 7A to 7C are cross-sectional views illustrating the process steps of a method of fabricating a semiconductor package in accordance with a second embodiment of the present invention. The steps shown in FIGS. 6A to 6C of the first embodiment are also used for the second embodiment of the present invention.

In FIG. 7A, a conductive adhesive such as a solder paste, conductive ball, and conductive film is applied to a horizontal leg parts 71a. FIG. 7B shows that a semiconductor chip 33 attached to the conductive adhesive 72 to contact the surface of the semiconductor chip 73. A semiconductor package according to the second embodiment of the present invention is completed by forming a upper coating 76 using a molding process as shown in 7C.

As described above, the column lead type semiconductor package according to the present invention can be applied to a center pad type semiconductor chip. By providing the column lead type semiconductor package structure and the method of fabricating the same according to the present invention, the column lead type semiconductor package is fabricated to provide a reliability and a more degree of freedom in designing the semiconductor package.

It will be apparent to those skilled in the art that various modifications and variations can be made in the semiconductor package and the fabrication method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor package, comprising the steps of;

forming a semiconductor package substrate having a frame-type insulator which has a penetrating portion in a center of the semiconductor package substrate and a plurality of leads buried in both circumferential surfaces of the insulator at both sides of the penetrating portion;

attaching an upper surface of a semiconductor chip having a plurality of pads on a center portion to lower surfaces of the leads;

connecting the pads with upper surfaces of the corresponding leads by wires; and forming an upper cover to protect the wires, the pads, and an upper surface of the semiconductor chip.

2. The method according to claim 1, further comprising the step of forming a lower cover on as surface of the semiconductor chip after the step of attaching the upper surface of the semiconductor chip.

3. The method according to claim 1, wherein the step of forming the semiconductor package substrate comprises the steps of:

placing a plurality of lead bars in a frame;

fabricating a column using an epoxy resin in the frame;

forming a penetrating portion in a center portion of the column;

fabricating a column unit by cutting the column to have a predetermined thickness; and forming a recess in an inner side of the column unit, each lead bar having a horizontal leg part and a vertical leg part.

4. The method according to claim 3, wherein the step of forming a recess includes a grinding process.

5. The method according to claim 1, wherein the step of forming an upper cover is performed by molding process.

6. The method according to claim 3, wherein the lead bar has a horizontal leg part and a vertical leg part which downwardly extends from an end portion of the horizontal leg part.

7. A method of fabricating a semiconductor package, comprising the steps of;

forming a semiconductor package substrate having a frame-type insulator which has a penetrating portion in a center of the semiconductor package substrate and a plurality of leads buried in both circumferential surfaces of the insulator at both sides of the penetrating portion;

attaching an upper surface of a semiconductor chip on a center portion to lower surfaces of the leads using a conductive adhesive; and forming an upper cover to protect an upper surface of the semiconductor chip.

8. The method according to claim 7, wherein the conductive adhesive includes one of a solder paste, conductive ball, and conductive film.

9. The method according to claim 7, wherein the step of forming the semiconductor package substrate comprises the steps of:

placing a plurality of lead bars in a frame;

fabricating a column using an epoxy resin in the frame;

forming a penetrating portion in a center portion of the column;

fabricating a column unit by cutting the column to have a predetermined thickness; and forming a recess in an inner side of the column unit, each lead bar having a horizontal leg part and a vertical leg part.

10. The method according to claim 9, wherein the step of forming a recess includes a grinding process.

11. The method according to claim 7, wherein the step of forming an upper cover is performed by a molding process.

12. The method according to claim 7, wherein the lead bar has a horizontal leg part and a vertical leg part which downwardly extends from an end portion of the horizontal leg part.

* * * * *

UNITED STATES PATENT AND TRADEMARK OFFICE
CERTIFICATE OF CORRECTION

PATENT NO. : 6,146,918
DATED : November 14, 2000
INVENTOR(S) : Lee

It is certified that error appears in the above-identified patent and that said Letters Patent is hereby corrected as shown below:

Claim 2,
Line 2, change "as" to -- a --.

Claim 5,
Line 2, change "by molding" to -- by a molding --.

Signed and Sealed this

Fourth Day of December, 2001

Attest:

*Nicholas P. Godici*

NICHOLAS P. GODICI
*Attesting Officer*  *Acting Director of the United States Patent and Trademark Office*